(12) United States Patent
Zhou

(10) Patent No.: US 7,501,638 B1
(45) Date of Patent: Mar. 10, 2009

(54) CHARGED PARTICLE BEAM EMITTING DEVICE AND METHOD FOR OPERATING A CHARGED PARTICLE BEAM EMITTING DEVICE

(75) Inventor: Fang Zhou, Feldkkirchen (DE)

(73) Assignee: ICT Integrated Circuit Testing Gesellschaft für Halbeiterprüftechnik mbH, Heimstetten (DE)

( * ) Notice: Subject to any disclaimer, the term of this patent is extended or adjusted under 35 U.S.C. 154(b) by 344 days.

(21) Appl. No.: 11/553,160

(22) Filed: Oct. 26, 2006

(30) Foreign Application Priority Data

Dec. 20, 2005 (EP) ................................. 05027889

(51) Int. Cl.
*H01J 37/10* (2006.01)
*H01J 37/147* (2006.01)

(52) U.S. Cl. ........................... 250/396 R; 250/396 ML; 250/397; 250/398

(58) Field of Classification Search ........................ None
See application file for complete search history.

(56) References Cited

U.S. PATENT DOCUMENTS

| | | | |
|---|---|---|---|
| 3,414,758 A | 12/1968 | Ebbesen | |
| 3,562,575 A | 2/1971 | Derr | |
| 4,090,106 A | 5/1978 | Okumura et al. | |
| 6,730,907 B1 * | 5/2004 | Feuerbaum et al. | 250/310 |
| 6,825,475 B2 * | 11/2004 | Petrov et al. | 250/396 ML |
| 6,825,476 B2 * | 11/2004 | Adamec | 250/398 |
| 6,936,817 B2 * | 8/2005 | Feuerbaum | 250/310 |
| 7,355,186 B2 * | 4/2008 | Jasinski | 250/431 |
| 7,378,668 B2 * | 5/2008 | Tanimoto et al. | 250/396 R |
| 7,425,714 B2 * | 9/2008 | Sakakibara et al. | 250/492.22 |
| 2003/0085360 A1 * | 5/2003 | Parker et al. | 250/396 R |
| 2003/0151367 A1 | 8/2003 | Toru et al. | |
| 2003/0168606 A1 * | 9/2003 | Adamec et al. | 250/396 R |
| 2005/0029473 A1 * | 2/2005 | Muraki et al. | 250/492.1 |
| 2006/0231772 A1 * | 10/2006 | Jasinki | 250/492.1 |
| 2007/0158588 A1 * | 7/2007 | Zhou et al. | 250/492.2 |

OTHER PUBLICATIONS

European Search Report for European Application No. 05027889.4-2208 dated Aug. 28, 2006.

* cited by examiner

*Primary Examiner*—David A. Vanore
(74) *Attorney, Agent, or Firm*—Patterson & Sheridan, LLP

(57) ABSTRACT

A charged particle beam emitting device includes at least two charged particle beam guns, each of the at least two charged particle beam guns having a separate charged particle emitter with an emitting surface for emitting a respective charged particle beam. The charged particle beam emitting device further includes an aperture element comprising at least one aperture opening and a deflector unit. The deflector unit is adapted for alternatively directing the charged particle beams of the at least two charged particle beam guns on the at least one aperture opening so that, at the same time, one of the at least two charged particle beams is directed on the aperture opening while the respective other charged particle beam of the at least two charged particle beams is deflected from the aperture opening by the deflector unit. At the same time, only one of the two charged particle beam guns is used so that the temporarily unused charged particle beam gun can be subjected to a cleaning procedure. This ensures that the emitting surfaces of both charged particle beam guns can be alternatively and frequently cleaned with minimum interruption of the operation of the charged particle beam device.

27 Claims, 4 Drawing Sheets

CHARGED PARTICLE BEAM EMITTING DEVICE AND METHOD FOR OPERATING A CHARGED PARTICLE BEAM EMITTING DEVICE

BACKGROUND OF THE INVENTION

1. Field of the Invention

The invention relates to improvements in the field of charged particle beam emitting devices and pertains particularly to a charged particle beam emitting device which includes at least two separate charged particle beam guns, and to a method for operating a charged particle beam emitting device.

2. Description of the Related Art

Advanced science and technology such as nanotechnology, biology and semiconductor industry places a high demand on charged particle beam emitting devices such as electron microscopes or electron beam writing devices with respect to reliability and performance. As an example, in semiconductor industry scanning electron microscopes are used for the inspection of manufactured semiconductor structures. The inspection is not restricted to the final semiconductor structure but also includes the inspection of intermediate manufacturing steps for the early identification of defective structures. Important aspects in semiconductor manufacturing are the yield and throughput of the manufacturing equipment. Although inspection and process diagnosis of intermediate structures allows the identification of defective semiconductor structures at a very early stage and hence enables the operator of the manufacturing equipment to react instantly, additional inspections also reduce the overall throughput of the manufacturing process. A reduction of any unwanted interruptions and delays of the manufacturing process caused by the testing equipment is therefore highly desired.

SUMMARY OF THE INVENTION

In view of the above a charged particle beam emitting device includes at least two charged particle beam guns, each of the at least two charged particle beam guns having a separate charged particle emitter with a separate emitting surface for emitting respective charged particle beams. The charged particle beam emitting device further includes a deflector unit and an aperture element comprising at least one aperture opening. The deflector unit is adapted for alternatively directing the charged particle beams of the at least two charged particle beam guns on the at least one aperture opening so that, at the same time, one of the at least two charged particle beams is directed on the aperture opening while the respective other charged particle beam of the at least two charged particle beams is deflected from the aperture opening by the deflector unit.

The charged particle beam emitting device is equipped with at least two alternatively employed active charged particle beam guns. Typically, the first and the second charged particle beam guns are substantially equal in their arrangement and emission characteristic to ensure that substantially identical charged particle beams are obtained. Both charged particles beam guns are maintained in an operative condition during the operation of the charged particle beam emitting device. However, they are employed alternatively, i.e. that only one of the two emitted charged particle beams is used at a given time for illuminating a specimen. The temporarily unused charged particle beam gun can be subjected to a cleaning procedure to clean its emitting surface for improving its emission characteristic. By means of the deflector unit it is possible to switch between the at least two charged particle beams. Typically, the charged particle beams are alternatively directed on the same aperture opening of the aperture element.

In view of the above, it is further provided a charged particle beam apparatus, which includes a charged particle beam emitting device as described above, and an imaging element defining a main optical axis of the charged particle beam apparatus. The charged particle beam emitting device is arranged with respect to the imaging element such that the aperture opening of the aperture element is aligned with respect to the main optical axis. The imaging element is adapted for focussing the respective charged particle beam of the first and second charged particle beam gun of the charged particle beam emitting device onto a specimen.

The charged particle beam apparatus is equipped with a charged particle beam emitting device having at least two charged particle beam guns. The deflector unit and the aperture opening are arranged such that a charged particle beam, which is directed on the aperture opening and which passes through it, is aligned with the main optical axis of the charged particle beam apparatus. Typically, the imaging element of the charged particle beam apparatus focuses the charged particle beam on a specimen which is held within the charged particle beam apparatus. The imaging element may comprise a plurality of separate elements such as filters, lenses and scanning units to allow a scan of the specimen surface by the charged particle beam. The switching between the two charged particle beams is particularly carried out when the charged particle beam apparatus is temporarily not used for its intended purpose or function. For example, the purpose of a scanning electron microscope is the imaging of a specimen surface. Appropriate periods for switching are for example specimen exchange or movement of a stage which carries and fixes the specimen during imaging. Another example of a charged particle beam apparatus is a beam writing apparatus for processing fine structures in a specimen such as a mask for lithographic purposes. Here, the charged particle beam is used to locally remove material from the specimen surface. Again, a specimen exchange or a period for calibrating the apparatus could be used for switching. Further examples are transmission electron microscopes (TEM), scanning transmission electron microscopes (STEM) and micro-structural analysis of surfaces.

Typically, the emitting surface of the respective charged particle emitters should be separated with respect to each other to reduce or prevent mutual contamination by molecules desorbed during cleaning. The emitting surfaces of the respective charged particle beam guns are accommodated in separate vacuum chambers. Particularly, a transfer of molecules from the emitting surface being currently cleaned to the working emitting surface can thus be prevented. The charged particle beam guns can be formed as separate vacuum chambers accommodating its respective emitting surface. Each charged particle beam gun can comprise at least a separate suppressor and extraction electrode. An opening in the extraction electrode, through which the respective charged particle beam is emitted, may also function as a differential aperture to separate the respective vacuum chambers. Optical elements can be incorporated into the separate vacuum chambers of the respective charged particle beam guns or can be externally arranged. Alternatively, a common optical element can be used for both charged particle beam guns.

It is further provided a method for operating a charged particle beam emitting device, the method includes the steps of (a) generating at least a first charged particle beam by emitting charged particles from an emitting surface of a first charged particle emitter and generating at least a second charged particle beam by emitting charged particles from an emitting surfaces of a second charged particle emitter, (b) directing the first charged particle beam on at least one aperture opening of an aperture element and deflecting the second charged particle beam from the aperture opening, (c) cleaning the emitting surface of the second charged particle emitter when its charged particle beam is deflected from the aperture opening, (d) subsequently to step (c) directing the second charged particle beam on the at least one aperture opening of the aperture element and deflecting the first charged particle beam from the aperture opening, (e) cleaning the emitting surfaces of the first charged particle emitter when its charged particle beam is deflected from the aperture opening, and (f) repeating steps (b) to (e).

In an aspect of the invention the switching between the two charged particles beams is synchronized with inactive or non-operational periods of the charged particle beam emitting device. Such inactive or non-operational periods are periods during which the charged particle beam is not or cannot be used for its intended purpose as described above. Such non-operational periods include periods for the exchange of samples to be investigated or tested, necessary calibration and adjustments and movements of the sample or specimen to allow investigation and testing of different portions of the sample. Those skilled in the art will appreciate that non-operational periods are not restricted to the examples set forth above and that they depend on the particular type of charged particle beam emitting device and its actual usage. For instance, a non-operational period of an electron microscope may comprise any period during which no image of the sample is obtained. On the other hand, non-operational or inactive periods of ion beam emitting devices or electron writing devices used for lithographic purposes includes periods during which no ion beam or electron beam is directed on a sample. In addition to that, the switching can be initiated upon request.

It is worth noting that non-operational periods are typically very short in comparison with operational periods during which the charged particle beam emitting device is used for its intended purpose.

Further advantages, features, aspects and details of the invention are evident from the claims, the description and the accompanying drawings. Although the invention is mainly described in conjunction with an electron beam emitting device, the invention is not restricted thereto but can generally be applied to particle beam emitting devices such as ion beam emitting devices. Those skilled in the art will appreciate that the charged particle beam emitting device, the charged particle beam apparatus and the method as set forth in detail below are suitable for any kind of charged particle beam emitting devices.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying figures. Therein.

DETAILED DESCRIPTION

Figure 1:
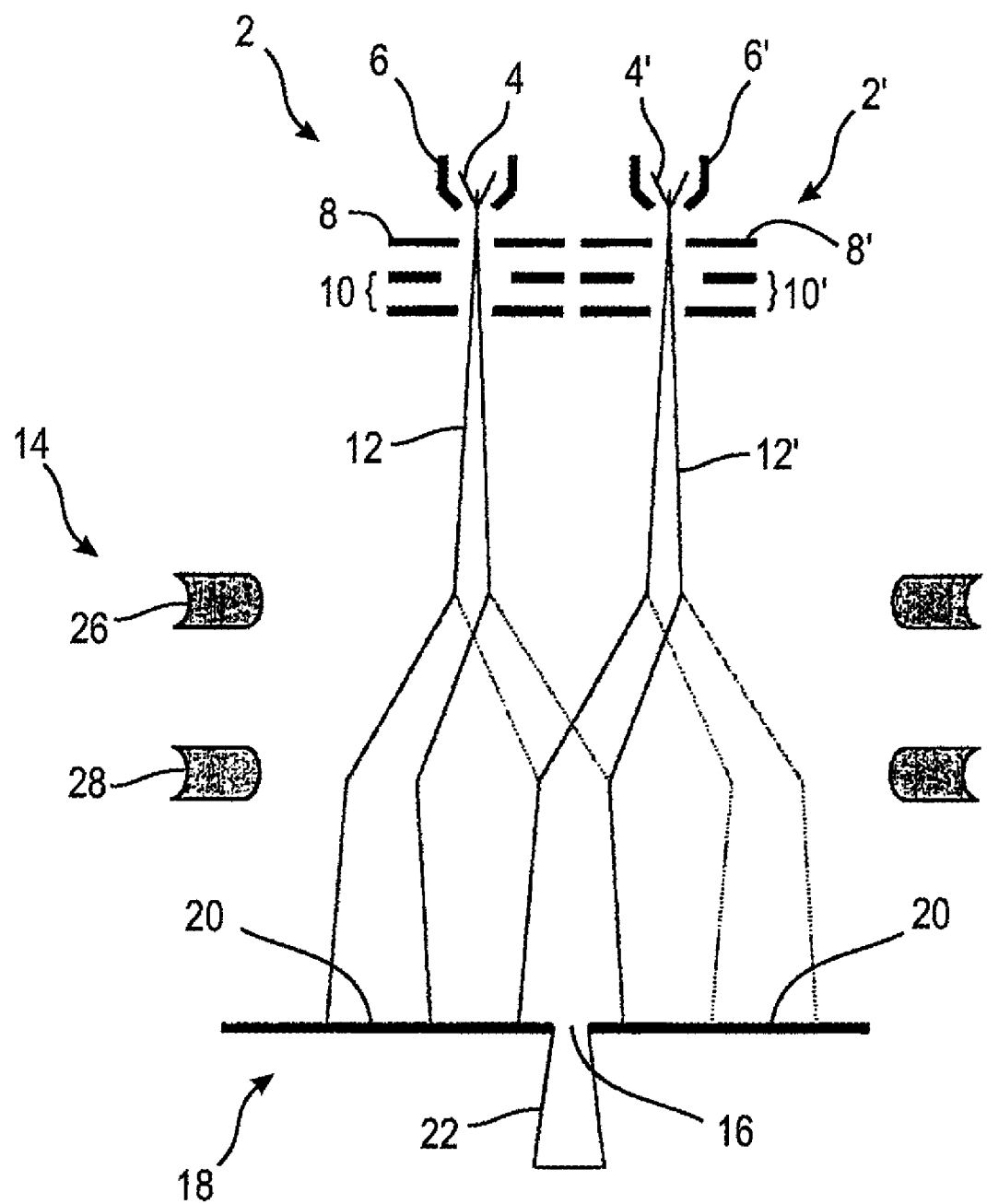
FIG. 1 shows an arrangement of an electron beam emitting device in accordance with a first embodiment.

For high throughput applications such as wafer inspection and process diagnosis, which employ charged particle beams, any interruption of the inspection process should be kept to a minimum and, particularly, should be avoided. Among charged particle beam emitting devices, electron beam emitting devices and in particular cold field emitters play an increasingly important role due to their high brightness and small source size. Cold field emitters exhibit a typical emission characteristic which is mainly influenced by the absorption and desorption of residual gas molecules on the emitting surface. The adsorption of residual gas molecules results in a decrease of the emission current. Therefore, the emitting surface of a charged particle emitter needs to be decontaminated periodically. To this end, the charged particle beam emitting devices or apparatuses have been previously shut down and the emitting surface of the charged particle beam gun of the respective apparatus or device has been subjected to a decontamination process. The intervals between consecutive decontamination processes were typically in the range of several hours and were determined by an increase of fluctuations of the emission current. Recently, a high frequency cleaning procedure with multiple separate short cleaning steps has been suggested by the same applicant to obtain very high and stable emission (European Patent application 019 259.0 "Charged particle beam emitting device and method for operating a charged particle beam emitting device" filed on 5 Sep. 2005, Attorney docket number 11809P-EP). This frequent cleaning procedure requires cleaning at intervals which are much shorter than those applied previously. Typical examples of short cleaning intervals are about 10 to 20 minutes. However, since the charged particle beam apparatus can not be used for its intended purpose during cleaning, frequently cleaning could adversely affect the throughput performance of a charged particle beam apparatus.

To improve the performance of charged particle beam apparatuses with respect to the throughput and emission characteristic, two separate charged particle beam guns are used which both are kept operative at the same time but which are used alternatively as a charged particle beam source. The charged particle beam gun, which is temporarily unused, is subjected to a cleaning process to clean its emitting surface. The switching between the two charged particle beam guns is typically synchronised with non-operational or inactive periods of the charged particle beam emitting device or apparatus, i.e. periods during which the device or apparatus is not used for its intended purpose. Such periods include, but are not restricted to, sample exchange, stage movements and system calibration.

The interval between consecutive switching steps depends on the cleaning condition of the emitting surfaces and the application for which the charged particle beam is used. For instance, if operational and non-operational periods alternate at high frequency, it is possible to switch between the two charged particle beam guns at the same frequency when a very high-frequency cleaning is required. If, on the other hand, such a high frequency cleaning is not required, the switching can be performed at a less frequent rate which, however, should be synchronized with the higher rate of alternations between operational/non-operational periods to avoid interruption of operational periods. Alternatively, if operational and non-operational periods alternate at low frequency, it might be required to switch between the two charged particle beam guns at higher rate to keep the emission stable at high level.

Typically, the cleaning processes might be required at intervals of more than about 60 sec and particularly of more than about 240 sec or 300 sec. Cleaning of the emitter surface every 4 to 20 minutes (intervals between about 240 sec and about 1200 sec) and in particular every 4 to 10 minutes (intervals between about 240 sec and about 600 sec) has proved to be sufficient for many applications. The period between consecutive cleaning processes is mainly determined by the quality of the vacuum. By increasing the quality of the vacuum, cleaning processes are less frequently required. As the maintenance of a very high or ultrahigh vacuum is very expensive, a segmentation of the charged particle beam emitting device or apparatus into separate compartments having different levels of vacuum is advantageous. For instance, the charged particle or electron beam emitting apparatus may include three chambers. In a first chamber, in which an ultra high vacuum is maintained, the charged particle beam emitters are arranged. A second or intermediated chamber is arranged in the direction of the optical axis of the charged particle beam emitting apparatus. Further down along the optical axis, a third or specimen chamber is arranged. First and second chamber and second and third chamber, respectively, are separated from each other by differential pressure apertures. The pressure in the third chamber is higher than in the second chamber which in turn has a higher pressure than the first chamber. Therefore, the best vacuum is maintained in the first chamber. The different levels of vacuum are maintained by separate vacuum pumps.

The segmentation of the charged particle beam emitting device or apparatus allows the vacuum in the first chamber, in which the charged particle beam emitter is arranged, to be kept at a very high level and prevents intrusion of contaminations from the other two chambers, particularly from the third chamber where contaminations are generated due to the interaction of the charged particle beam with the specimen surface. As a consequence, the first chamber is less likely to be contaminated and, consequently, a cleaning is less frequently required. Further aspects and details of separated chambers of a charged particle beam emitting apparatus can be inferred from WO 2005/027175 of the same applicant, the disclosure of which is hereby incorporated by reference in its entirety.

Frequently cleaning of the emitting surface keeps the emission current of the respective charged particle beam guns at a very high level well above a so-called stable mean emission value. For a more detailed description of the frequent cleaning procedure, reference is made to the above mentioned EP-patent application 019 259.0 of the same applicant, the disclosure of which is hereby incorporated by reference in its entirety. Briefly, a typical emission characteristic of a clean cold field emitter under a constant extraction field exhibits an initial high emission current. Upon further operation under standard conditions (i.e. under a constant electric extraction field, a given vacuum and a constant low temperature), the emission current declines continuously due to increasing adsorption of residual gas molecules in the vacuum on the emitting surface of the cold field emitter. At the same time, gas molecules adhering to the emitting surface begin to desorb from the emitting surface so that adsorption and desorption of gas molecules are balanced after a certain period of time. When the balance condition is reached, in other words, when a dynamical equilibrium of adsorption and desorption has been established, the emission current is substantially stable and assumes a stable mean emission current. Under this balanced condition the emission current fluctuates around the substantially stable mean emission current which is well below the initial high emission current. An exemplary emission current of a cold field emitter is for instance shown in FIG. 1 of Okumura et al. (U.S. Pat. No. 4,090,106). The extent of the initial decline depends on the quality of the vacuum, and the decline is more pronounced in low pressure vacuum. Therefore, ultra high vacuum conditions are particularly desired for the operation of charged particle emitters. In order to obtain a reasonably stable emission, an ultra high vacuum is required which is typically betterthan $1.33*10^{-7}$ Pa ($10^{-9}$ Torr) and in particular better than $1.33*10^{-9}$ Pa ($10^{-11}$ Torr).

By subjecting the respective emitting surfaces to cleaning processes at periods which are substantially shorter than the duration of the initial decline, the contamination of the emitting surfaces can be drastically reduced which results in a continuously very high emission current well above the stable mean emission current. To keep the interruption caused by the frequent cleaning low, the at least two charged particle beam guns having separate charged particle emitters are employed alternatively. The cleaning of the emitting surface of the temporarily unused charged particle beam gun is typically performed shortly before switching.

During operation of the charged particle beam emitting device or apparatus, the respective emitting surface is cleaned by applying at least one heating pulse to the emitting surface. The cleaning takes place when the respective charged particle beam gun is temporarily unused. For example, less than 10 and, in particular, 2 to 4, heating pulses are applied to the emitting surface. The duration of each single heating pulse and the time between consecutive heating pulses can be chosen according to specific needs. By applying frequent cleaning, charged particle beam emitters with practically unlimited lifetime are obtained.

Further, the first and second charged particle beams can be alternatively directed on the aperture opening such as to form a substantially continuous particle beam passing through the aperture opening. Apart from the switching period, which should be kept very short, a continuous charged particle beam is generated and is made available for the respective application or purpose of the charged particle beam emitting device or apparatus. A substantially uninterrupted charged particle beam can thus be provided by the charged particle beam emitting device and, as the respective emitting surfaces are periodically cleaned when they are not in use, the emission current obtainable is very high and close to the maximum available emission current and exhibits a low noise. Further, it is not required to deactivate temporarily the charged particle beam emitting device for cleaning as required by conventional charged particle beam emitting devices which merely include a single charged particle beam gun. This is particularly of great advantage for high throughput applications such as wafer inspection, process diagnostics or material processing using a focused charged particle beam.

The temporarily unused charged particle beam, i.e. the respective charged particle beam, which is deflected from the aperture opening, can be directed on a blanking portion of the aperture element. The blanking portion protects other parts of the charged particle beam device or apparatus and, in particular, the specimen against the temporarily unused charged particle beam, the intensity of which can substantially increase during cleaning due to the application of heating pulses which could stimulate thermal emission. Therefore, one of the at least two charged particle beams passes through the aperture opening while the other one of the at least two charged particle beams is blocked at the same time by the blanking portion. The at least two charged particle beams are alternatively switched between a blocking state (the beam is directed on the blanking portion) and a transmission state (the beam is directed on the aperture opening and passes through it). It is also possible that the aperture element includes one, two or a plurality of aperture openings.

For operating the charged particle beam emitting device, a first control signal can be applied for alternatively switching the first and second charged particles beams, and a second control signal can be applied for alternatively initiating a cleaning of the respective emitting surface of the first and second charged particle emitter. The first control signal and the second control signal may be applied such that the switching is performed with a time delay $\Delta t$ with respect to the termination of the cleaning process to ensure that the cleaning process is terminated before the switching is initiated. The time delay $\Delta t$ can be between 0.5 sec and 120 sec. preferably between about 0.5 sec and 10 sec and more preferably about 0.5 sec and 1 sec.

In addition to that, the movement of the specimen by the carrying unit can be used as a triggering event to trigger the switching. Typically, one of the two charged particle beams is directed on the aperture opening and focussed on a specimen, for instance, to image a portion of the specimen surface. After completion of the imaging, the specimen might be moved to allow imaging of another surface portion of the specimen. This movement can trigger a switch so that the currently unused charged particle beam gun, which has been meanwhile subjected to a cleaning procedure, is used for the next imaging. Typically, the movement of the specimen defines non-operational periods and includes a transfer of the specimen into or out of a vacuum chamber or a movement of the specimen within the vacuum chamber to expose different portions of the specimen to the charged particle beam.

It is further possible that each of the at least two charged particle beam guns include a separate optical element. Each optical element is adapted to change the beam angle of the respective charged particle beam, i.e. to concentrate the charged particle beam such as collimating, converging or focusing, or to diverge the charged particle beam such as expanding. Typically, the optical element is a concentrating element to reduce the beam angle of the respective charged particle beam and, in particular, to collimate the beam. Alternatively, the charged particle beam guns may include a common optical element such as a common gun lens. Typically, a magnetic lens is used as common optical element.

In addition to that, the at least one aperture opening of the aperture element defines an optical axis, and at least one of the at least two charged particle beam guns can be arranged in displaced relation with respect to the optical axis. Alternatively, each of the at least two charged particle beam guns can be arranged in displaced relation with respect to the optical axis. The displaced arrangement of the charged particle beam guns and hence of their emitting surfaces with respect to the optical axis of the aperture element is of advantage with respect to contamination of the respective emitting surfaces. The small apertures arranged on the optical axis, particularly the differential vacuum apertures, collimate a beam of residual gas molecules, which stems from the low vacuum area and which comes into the high vacuum area of the gun lenses, along the optical axis. Thus, the displaced arrangement of the charged particle beam guns with respect to the optical axis of the aperture opening substantially reduces the probability that residual gas molecules can strike the respective emitting surfaces.

The at least two charged particle beam guns can also be arranged such that their respective charged particle beams are orientated at an angle which is different from 0°. Typically, the angle is about 1° to 30° and, preferably, about 5°. Further, the deflector unit can be adapted to merely change the beam direction of the at least two charged particle beams. In this arrangement, a single deflector element is typically used as a deflector unit which is capable of changing the direction of the respective beams.

Alternatively, the at least two charged particle beam guns can be arranged such that their respective charged particle beams are oriented parallel with respect to each other. In this arrangement, the deflector unit can be adapted to shift laterally the at least two charged particle beams. Double deflector units are typically used for parallel emitting charged particle beam guns. A double deflector unit typically includes at least two single defector elements. Both deflector elements, each of which deflects the respective charged particle beams, typically work in a reverse manner with respect to each other such that one deflector element bends the respective charged particle beam about a given angle while the other deflector element bends the respective charged particle beam back about that angle. This double or zigzag bending causes a lateral shift of the respective charged particle beams without changing their direction or orientation. However, those skilled in the art will appreciate that the extent to which the at least two charged particle beams are laterally shifted may be affected by inhomogeneities of the deflector elements since electrostatic, magnetostatic and/or electromagnetostatic elements are used as deflector elements for charged particle beams. Hence, when referring to a "parallel shift" it is meant that the respective charged particle beams are shifted in a substantially parallel manner.

In an embodiment, each of the at least two charged particle beam guns includes a separate heating element for heating the respective emitting surface. The heating elements are used to separately heat and clean the respective emitting surfaces. A cleaning is performed when the respective charged particle beam is not used, i.e. when it is deflected from the aperture opening. Examples of heating elements are resistance heating filaments arranged in close proximity to the emitting surface and optical radiation sources, the radiation of which is directed onto the emitting surface. An optical radiation source is for example an infrared laser.

In a further embodiment, the charged particle beam emitting device is an electron beam emitting device, the at least two charged particle beam guns are at least two electron beam guns and the charged particle beams are electron beams. Examples are photo-emitter guns and, in particular, cold field emitters. Alternatively, the charged particle beam emitting device can be an ion beam emitting device, the at least two charged particle beam guns are at least two ion guns and the charged particle beams are ion beams. Particularly, "cold" charged particle beam guns are used. Within this application, a "cold" charged particle emitter and gun refer to those emitters and guns, which have energy sources other than thermal sources for stimulating the emission of charged particles. "Cold" charged particle emitters or guns are for instance the above mentioned photo-emitter and cold field emitters. For photo-emitters, the electromagnetic radiation of a given wavelength or wavelength range is used as an energy source to stimulate photo-emission. On the contrary, a sufficiently strong electromagnetic field is applied to the emission surface of a cold field emitter to enable the electrons to traverse the barrier between the emitter material and the vacuum. Other examples are cold ion emitters. On the other hand, "thermal" emitters are heated to provide the energy required for the electrons to traverse the barrier. Preferably, "cold" emitters are typically used but no "thermal" emitters.

In accordance with another embodiment, the charged particle beam emitting device is adapted for attaching to a charged particle beam apparatus having a main optical axis such that the aperture opening of the charged particle beam emitting device is aligned with the main optical axis of the charged particle beam apparatus. This provides for an easy integration of the charged particle beam emitting device into an existing charged particle beam apparatus. Thereby, the optical axis of the aperture opening and the main optical axis of the charged particle beam apparatus are aligned with respect to each other such that the respective charged particle beams, which traverse the aperture opening, are aligned with the main optical axis. The charged particle beam emitting device is a separate module which is detachably mounted to the charged particle beam apparatus. Alternatively, the charged particle beam emitting device can be an integral part of a charged particle beam apparatus so that, for example, a double deflector system of the apparatus can be used as deflector unit.

Irrespective of the actual configuration (separate module or integral part of the charged particle beam apparatus), the charged particle beam apparatus can include a control means for controlling the deflector unit and the imaging element. Further, the charged particle beam apparatus may also include a memory element for storing at least two sets of parameters, whereby the memory element is connected with the control means. Each set of parameters is assigned to a respective one of the at least two charged particle beam guns, whereby the set includes parameter values for controlling the deflector unit and the imaging element. Each set of parameters may also include parameters for beam alignment and stigmator required to aligned and focus the respective charged particle beam when employed. The sets differ from each other as each charged particle emitter has its unique characteristics. The stored sets of parameters are called in turn upon switching to generate a high-quality electron beam without any break which is required for extremely demanding applications such as wafer and mask inspections.

Further, the charged particle beam apparatus can also include a carrying element for movably carrying a specimen, a motion control unit for controlling the carrying element and a synchronising means adapted to synchronise the switching of the charged particle beams with a movement of the carrying element. The carrying element can be a stage for holding a specimen within the charged particle beam apparatus or a transfer unit for transferring a specimen into or out of the charged particle beam apparatus. In principle, the carrying unit can be adapted for holding, fixing, transferring and handling of a specimen and is not restricted to a stage or transfer unit.

Subsequently, concrete embodiments will be described in connection with the accompanying figures. In these embodiments, the charged particle beam emitting device and the charged particle beam apparatus are mainly described in connection with a scanning electron microscope having cold field emitters. However, those skilled in the art will appreciate that the present invention is not restricted thereto but also includes photo emitters and ion emitters.

FIG. 1 shows a charged particle beam emitting device with two charged particle beam emitting guns 2, 2' which emit substantially parallel to each other. Each of the charged particle beam emitting guns 2, 2', which are in this embodiment electron beam guns, includes a separate electron emitter 4, 4' as charged particle emitter, a separate suppressor electrode 6, 6', a separate extraction electrode 8, 8' and a separate focusing lens 10, 10' as optical element. As it becomes clear in connection with FIG. 5, each component of the respective electron beam gun 2, 2' is controlled by appropriate controlling means. As each electron beam gun 2, 2' can be individually addressed and controlled, two independent controllable electron beams 12, 12', which form here the at least two charged particle beams, are generated. Each electron beam gun should include at least a separate suppressor electrode and a separate extraction electrode which may form, together with other housing parts not shown, separate vacuum chambers to accommodate the respective emitting surface so that the emitting surfaces are separated from each other with respect to the vacuum. The focussing lenses can be separately formed or can be designed as a single element common to both electron beam guns.

A double deflector unit 14, which includes two separate beam deflector elements 26, 28, alternatively directs the electron beams 12, 12' on an aperture opening 16 of an aperture element 18. The aperture element 16 has a diameter of about 100 μm to about 500 μm and, particularly, of about 100 μm to 200 μm. The respective electron beam 12, 12', which is deflected off the aperture opening 16, is directed on a blanking portion 20 of the aperture element 18. In this embodiment, the blanking portion 20 is a portion which completely surrounds the aperture opening 16. FIG. 1 illustrates a situation in which the electron beam 12' is directed on the aperture opening 16 while the electron beam 12 strikes the blanking portion 20 (solid lines). By using the double deflector system 14 shown in FIG. 1 the two electron beams 12, 12' are laterally shifted so that their initial emission direction remains unchanged. After switching, electron beam 12 is directed on the aperture opening 16 while electron beam 12' strikes blanking portion 20 of aperture element 18 (dotted lines). The respective electron beam 12, 12', which is directed on aperture opening 16, is also aligned with an optical axis (not shown) of the aperture opening 16, which runs here centrally through the aperture opening and perpendicular to the lateral extension of the aperture element 18. A substantially continuous electron beam 22 is therefore formed by the alternatively employed electron beams 12, 12'. Electron beam 22 is aligned with the optical axis of the aperture opening 16.

Figure 2:
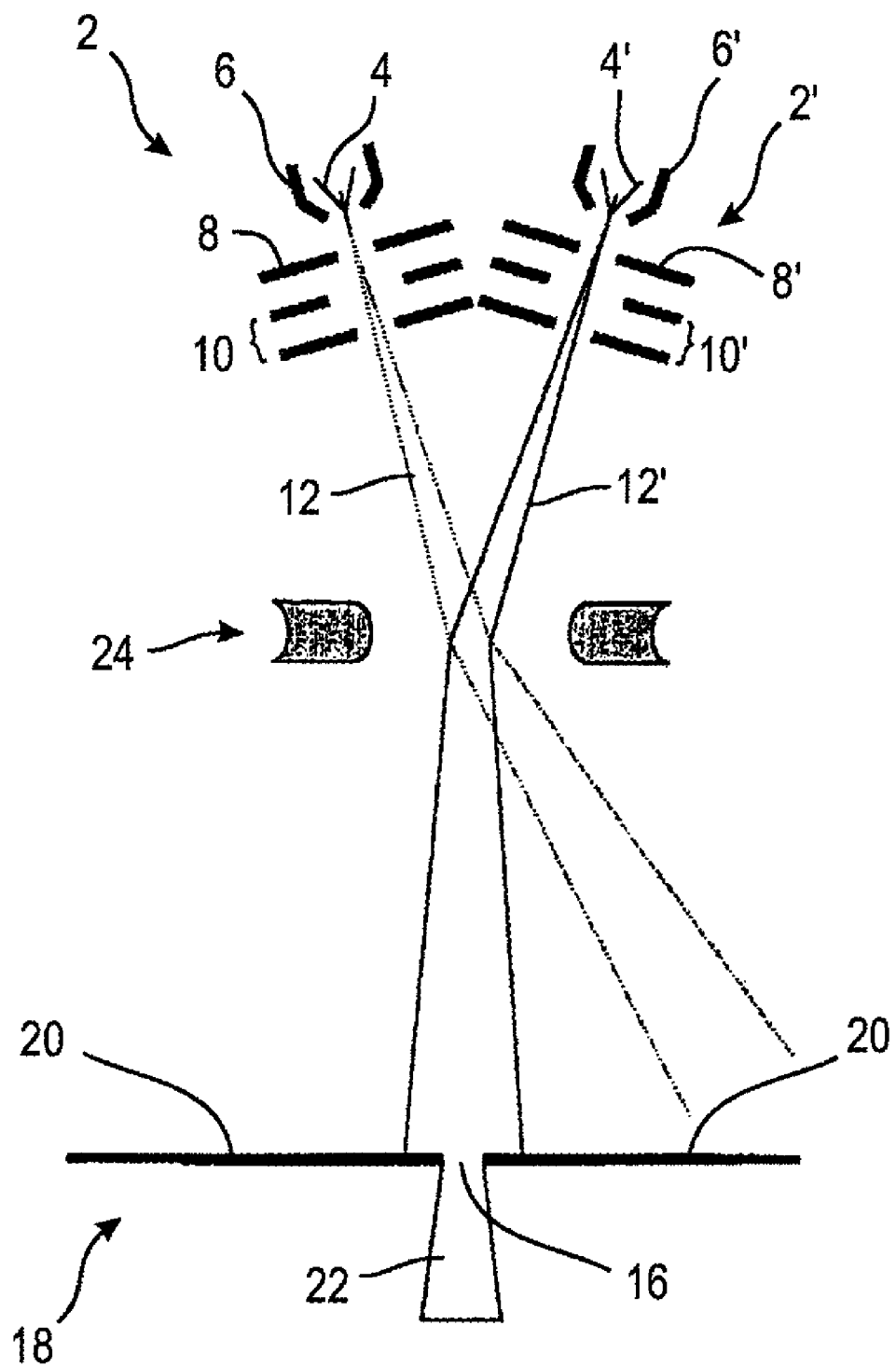
FIG. 2 shows an arrangement of an electron beam emitting device in accordance with a second embodiment.

Turning now to FIG. 2, a charged particle beam emitting device having two electron beam guns 2, 2' with tilted emission is described. Each electron beam gun 2, 2' has an arrangement which is similar to that described in connection with FIG. 1. The main difference between the embodiments of FIGS. 1 and 2 is that the electron beam guns 2, 2' do not emit parallel to each other but at an angle of about 5°. Further, a deflector unit 24 having only a single deflector element is required in the embodiment of FIG. 2 for alternatively deflecting the respective electron beams 12, 12' on aperture opening 16 of aperture element 18. As shown in FIG. 2, electron beam 12' traverses aperture opening 16 and forms electron beam 22 while electron beam 12 is deflected from aperture opening 16.

Since the electron beam guns are not aligned with the optical axis of aperture opening 16, most of the residual gas molecules which stem from the low vacuum area cannot reach the emitting surface of the electron emitters. Thus, the emitting surfaces are protected from being contaminated.

The respective gun lens of each electron beam gun may be an electrostatic or magnetic element or a combination of electrostatic and magnetic elements. Alternatively, a common magnetic lens can be used for both electron beam guns. The aperture opening may be a single hole or multi-holes.

The deflector unit used to deflect the electron beams can be a double deflector system of a microscope as for instance shown in FIG. 1. In this case, the charged particle beam emitting device is incorporated into the electron microscope. Alternatively, the charged particle beam emitting device can be formed as a separate module adapted to be detachably mounted to the electron microscope so that the optical axis defined by aperture opening 16 is aligned with the main optical axis of the electron microscope. This allows an easy replacement of existing charged particle beam emitting devices having only a single charged particle beam guns with a charged particle beam emitting device including two separate charged particle beam guns as described here.

Figure 5:
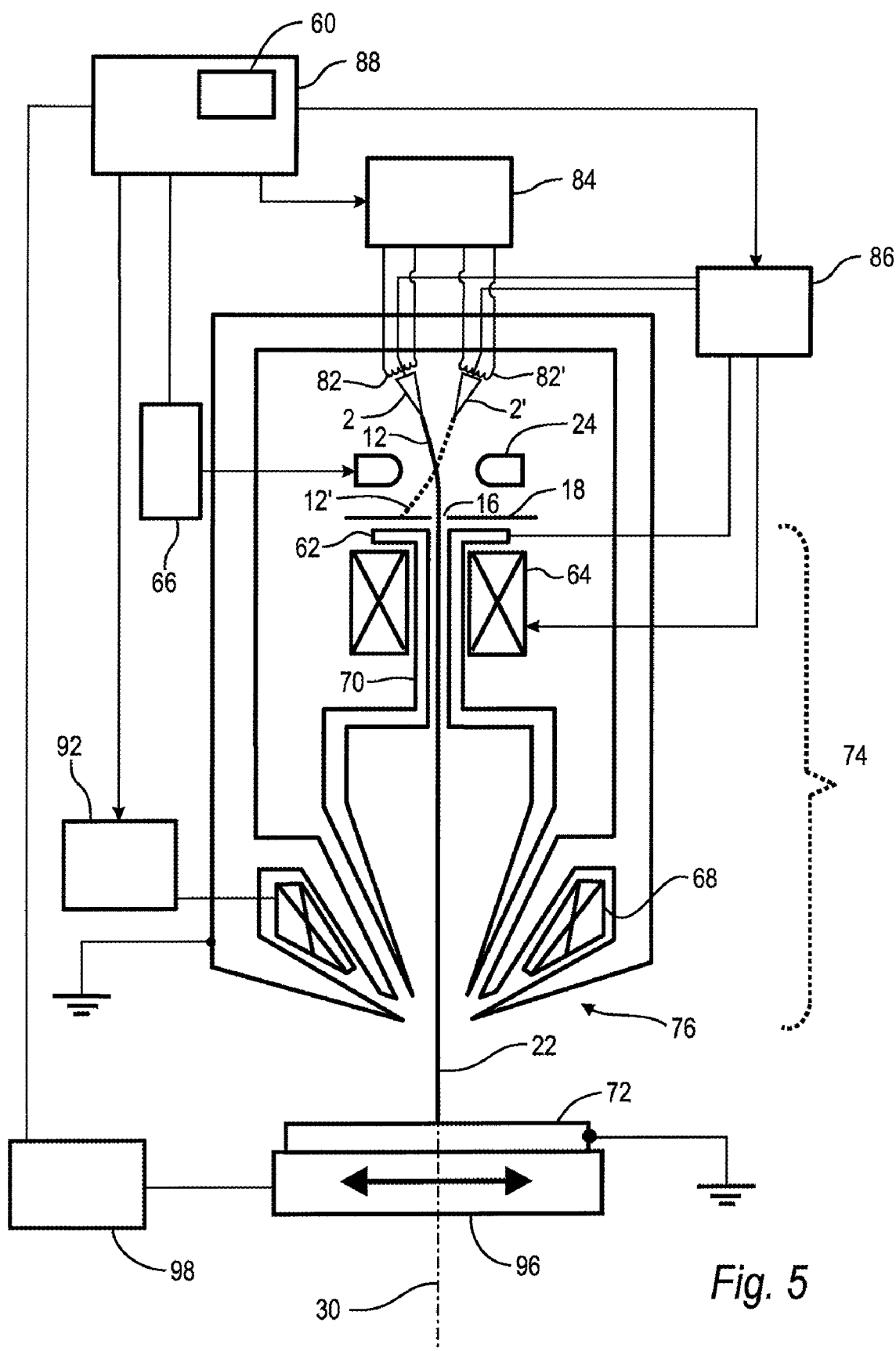
FIG. 5 shows a more detailed arrangement of the charged particle beam apparatus.

With reference to FIG. 5 a charged particle beam apparatus is described. In this embodiment, the charged particle beam apparatus is a scanning electron microscope having two electron beam guns (charged particle beam guns) 2, 2', each of which includes a separate electron emitter (charged particle beam emitter), a separate extraction electrode and a separate suppressor electrode not shown. FIG. 5 is for illustrative purpose and is not drawn to scale.

Each of the electron beam guns 2, 2' generates a charged particle beam 12, 12'. Aperture opening 16 of aperture element 18 is aligned with a main optical axis 30 of the scanning electron microscope. As illustrated, electron beam 12 passes through aperture opening 16 to form electron beam 22 which is directed on a specimen 72. Electron beam 22 is accelerated by an anode 62 to energy of about 10 keV and guided through a high voltage beam column 70 towards the sample or specimen 72. The high voltage beam column 70, which is part of a beam optical system 74, which forms an imaging element of the charged particle beam apparatus, keeps the electrons of electron beam 22 at high energy before deceleration. The high energy of the electrons during their passage through the beam optical system 74 ensures low diffusion and spreading of electron beam 22.

In addition to the above mentioned components, beam optical system 74 may include a condenser 64 and a final focus lens 76 for focussing electron beam 22 onto specimen 72. The final focus lens 76 focuses the electron beam 22 by means of a combination of a magnetic field generated by a final focus magnet coil 68 and an electric field generated by a voltage applied between specimen 72 and high voltage beam column 70. The high voltage beam column 70 is electrically connected to anode 62 in order to provide an electric field free region for transporting the electron beam 22 towards specimen 72. In a region between final focus lens 76 and specimen 72, electron beam 22 becomes decelerated to a desired final energy at which the specimen is meant to be inspected. It is for clarity purposes of the drawings only that the beam optical system 74 illustrated in FIG. 5 shows only some of the components which are usually implemented in a SEM. For example, FIG. 5 does not show additional apertures, separate vacuum chamber, deflectors for scanning the specimen surface or detectors for secondary electrons. However, a skilled person will appreciate that the illustrative SEM of FIG. 5 may include additional components depending on the application of the SEM.

By employing the deflector unit 24, each of the respective electron beams 12, 12' can be directed on the aperture opening to form electron beam 22. For cleaning purposes, each electron beam gun 2, 2' includes a heating element 82, 82' for applying heating pulses to the respective emitter surface. Examples of heating elements are resist heater such as the tungsten wire of a cold field emitter and laser, the beam of which is directed onto the emitter surfaces. Instead of using the tungsten wire a separated resistance heater can be used as well. Heating elements 82, 82' are controlled by a heating control unit 84. The high voltage applied to electron beam guns 2, 2' and anode 62 is controlled by a voltage unit 86, and the final focus magnet coil 68 is controlled by a focussing unit 92. Deflector unit 24 is controlled by a deflector controller 66. A main control unit 88 is provided for controlling the heating control unit 84, voltage unit 86, deflector controller 66 and focussing unit 92.

Upon movement of specimen 72, for example during a wafer exchange, control unit 88 initiates a switching between the respective electron beam guns 2, 2'. To this end, control unit 88 includes a memory element 60 for storing sets of relevant parameters for the operation of each electron beam gun 2, 2' and the scanning electron microscope. The parameters are defined or determined in advance so that the electron beam 22, which is alternatively formed by electron beams 12, 12' remains substantially constant. The parameters, which are assigned to the currently used electron beam gun, are temporarily stored in the relevant control units such as the voltage control unit 86 for controlling the anode voltage, the focussing unit 92 for controlling the final focus lens 68 and deflector controller 66. Upon switching, the relevant parameters of the currently unused and cleaned electron beam gun are transferred to the respective control units. The time required to switch is very short and is about 50 msec to about 500 msec. Each electron beam gun remains active irrespective of whether or not it is currently used. In particular, the extraction voltage is applied to both electron beam guns so that each gun continuously generates an electron beam.

Shortly before switching, a cleaning process is performed by prompting heating control unit 84 to apply heating pulses to the emitter surface of the currently unused electron beam gun.

A trigger signal for switching can be provided by a triggering unit or by a synchronising means 98 which is operatively connected with a motion controller for controlling the movement of a carrying element 96. The motion controller is not shown in FIG. 5. Alternatively, the main control unit 88 controls any control unit including the motion controller so that the switching takes place after lapse of a predetermined period or when the main control unit 88 triggers a movement of the carrying 96. The synchronising means 98 can therefore be an integral part of the main control unit 88. The carrying element 96 can be for instance a stage for holding the specimen during inspection or imaging or can be a transfer unit for transferring the specimen into and out of the charged particle beam apparatus.

During cleaning, the emitting surface is heated to a cleaning temperature, which can be in the range of about 1800 K to 2500 K and preferably of about 2200 K to 2500 K. The temperature upon which the emitting surface is heated depends on the material of the electron emitter. The above given temperature range is particularly suitable for tungsten emitters. Those skilled in the art are aware that the temperature needs to be adjusted for the specific material used for the electron emitter. Typically, short heating pulses are applied to the emitter surface. The application of heating pulses is often referred to as flashing. Each heating pulse may last about 1 to 2 sec.

Figure 3:
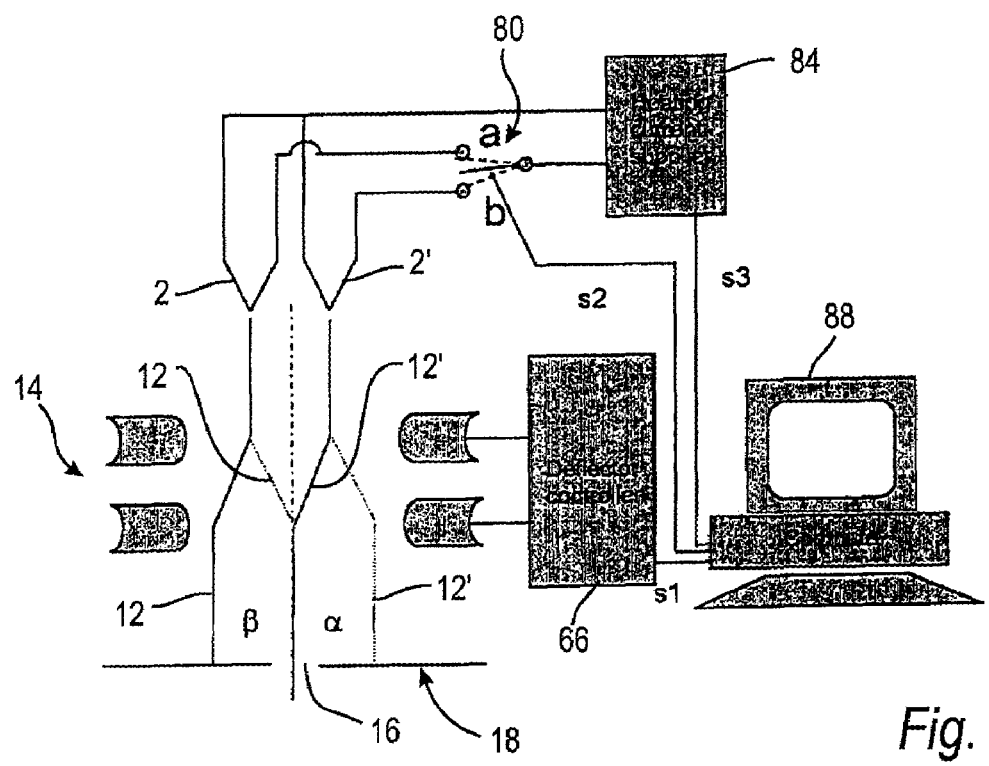
FIG. 3 shows an arrangement of a charged particle beam apparatus.
Figure 4:
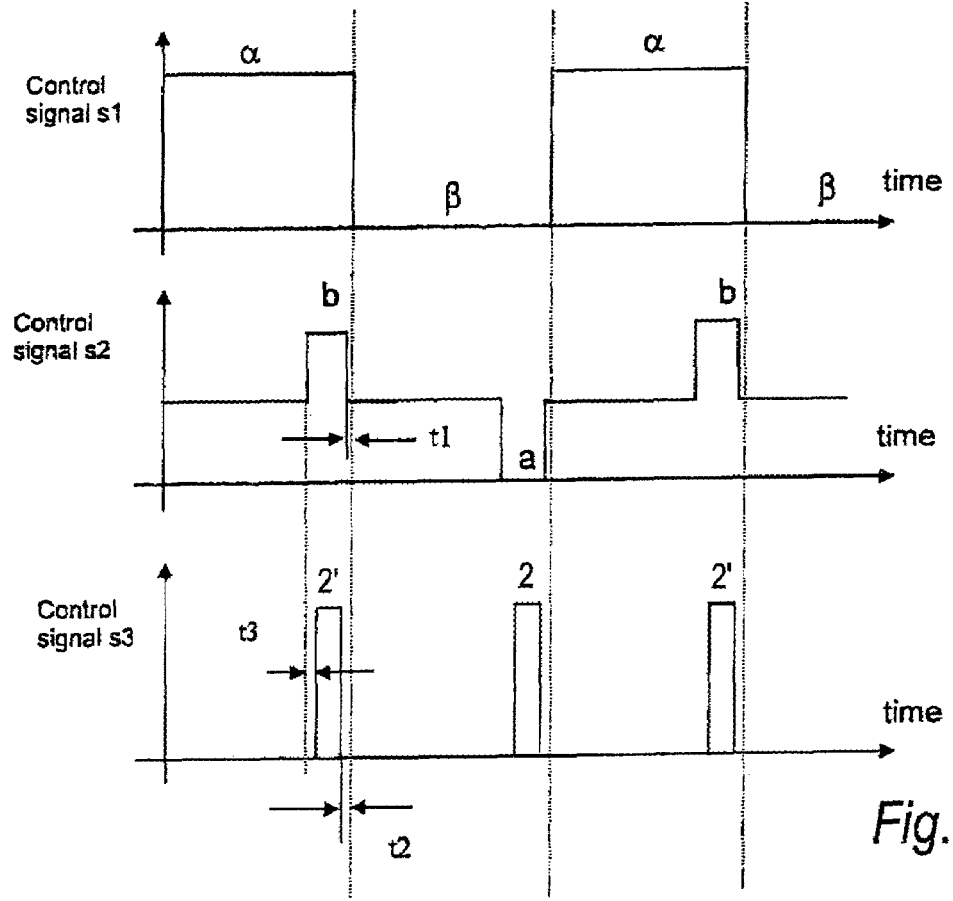
FIG. 4 shows a sequence of control signals for controlling the switching and cleaning of two charged particle beam guns of the charged particle beam apparatus.

With reference to FIGS. 3 and 4 the switching and cleaning procedures are described in more detail. The switching and cleaning is controlled by the main control unit 88, which can be a computer. The switching procedure is controlled by signal s1, which assumes two different states α and β. State α indicates that the electron beam 12 of electron beam gun 2 is in use while state β indicates that the electron beam 12' of electron beam gun 2' is in use. Both states are well adjusted and the relevant alignments parameters are stored in the memory of the computer 88. Alternatively, parameters for the deflector unit can also be stored in the deflector controller 66. The cleaning process is controlled by signals s2 and s3. Signal s2 determines which electron beam gun is connected to a heating current supplier 84. To this end, each heating element of the respective electron beam guns 2, 2' is connected with the heating current supplier 84 by a switch 80. Switch 80 has three switching positions, a middle position which is not connected with any of the heating elements and two outer positions, each of which is connected with a respective heating element. Switching position a indicates that heating element of electron beam gun 2 is connected with heating current supplier 84 while switching position b indicates that heating element of electron beam gun 2' is connected with heating current supplier 84. When switch 80 is in its middle position each of the heating elements is disconnected from heating current supplier 84. As the cleaning procedure is typically substantially shorter than the period of continuous use of any of the two electron beam guns, the heating elements of both electron beam guns 2, 2' are not connected with heating current supplier 84 most of the time. The period of continuous use of any of the two electron beam guns corresponds to the duration of states α or β. Signal s3 controls the cleaning or flashing temperature and the flashing duration by means of heating current supplier 84. The three controls signals s1, s2 and s3 are synchronised in the way shown in FIG. 4. The flashing or cleaning procedure should be completed just before the electron beam is switched from state α to β or β to α. Therefore, a time delay Δt is required between termination of the cleaning process and switching. In FIG. 4, time delay Δt corresponds to t2. As shown, the flashing and therefore the cleaning process is terminated before the respective heating element is disconnected from heating current supplier 84. The following values for t1, t2 and t3 have proved to be suitable for most applications: t1=1 sec, t2=2 sec and t3=1.5 sec.

The duration of states α and β depends on the beam quality. Further, the duration can also be governed by a sequence of events of a specific application, for which the electron beam is used. Those specific applications include wafer inspection or processing of a lithographic mask. To reduce any unwanted interruption by switching between the electron beams, it is preferred to synchronise the switching with the termination of the inspection or processing period. For wafer inspection applications, the beam switching should be synchronized with a frame blanking signal indicating a transfer of the wafer or a movement of the stage on which the wafer rests during inspection. This ensures that no switching occurs during inspection.

Typical values of cleaning intervals are in the range of 5 to 60 minutes. In many applications, the cleaning might be required at intervals of more than about 240 sec or 300 sec. To obtain a very bright emission with a very small noise cleaning intervals of about 4 to 20 minutes (240 sec to 1200 sec) have proved to be sufficient for many applications. The period between consecutive cleaning processes is mainly determined by the quality of the vacuum. By increasing the quality of the vacuum, cleaning processes are less frequently required. Alternatively, the charged particle beam apparatus can be divided into separate compartments having different levels of vacuum as described above to reduce the effort for generating ultrahigh vacuum.

Preferably, a single cleaning process should last less than about 60 seconds or even substantially shorter than that, for example less than 20 or 10 seconds.

When the electron beam emitting device is an electron microscope used for process diagnostic or wafer inspection during manufacturing of integrated circuits formed on semiconductor wafers, the switching process may be applied in combination with imaging or specimen activities. For example, the switching process can be carried out only in the interval of an extended frame blanking. For instance, for CD/DR (critical dimension/defect review) wafer inspection, the switching process may be done in the swap time between wafer exchanges which is about 10 sec. Other electron beam emitting devices are transmission electron microscopes (TEM) and scanning transmission electron microscopes (STEM) which strongly benefit from the improved brightness and reduced noise gained by the frequent cleaning of their emitters.

The invention claimed is:

1. A charged particle beam emitting device, comprising:
   at least two charged particle beam guns, each of the at least two charged particle beam guns having a separate charged particle emitter with a separate emitting surface for emitting respective charged particle beams;
   an aperture element comprising at least one aperture opening; and
   a deflector unit, the deflector unit being adapted for alternatively directing the charged particle beams of the at least two charged particle beam guns on the at least one aperture opening so that, at the same time, one of the at least two charged particle beams is directed on the aperture opening while the respective other charged particle beam of the at least two charged particle beams is deflected from the aperture opening by the deflector unit.

2. The charged particle beam emitting device as claimed in claim 1, whereby the aperture element comprises a blanking portion and the charged particle beam being deflected from the aperture opening is directed on the blanking portion.

3. The charged particle beam emitting device as claimed in claim 1, whereby each of the at least two charged particle beam guns comprises a separate optical element.

4. The charged particle beam emitting device as claimed in claim 1, whereby the at least two charged particle beam guns comprise a common optical element.

5. The charged particle beam emitting device as claimed in claim 1, whereby the at least one aperture opening of the aperture element defines an optical axis, and at least one of the at least two charged particle beam guns is arranged in displaced relation with respect to the optical axis.

6. The charged particle beam emitting device as claimed in claim 5, whereby each of the at least two charged particle beam guns is arranged in displaced relation with respect to the optical axis.

7. The charged particle beam emitting device as claimed in claim 1, whereby the at least two charged particle beam guns are arranged such that their respective charged particle beams are orientated at an angle being different from 0°, and whereby the deflector unit is adapted to change the beam direction of the at least two charged particle beams.

8. The charged particle beam emitting device as claimed in claim 1, whereby the at least two charged particle beam guns are arranged such that their respective charged particle beams are oriented parallel with respect to each other, and whereby the deflector unit is adapted to shift laterally the at least two charged particle beams.

9. The charged particle beam emitting device as claimed in claim 1, whereby each of the at least two charged particle beam guns comprises a separate heating element for separately heating the respective emitting surface.

10. The charged particle beam emitting device as claimed in claim 1, whereby the charged particle beam emitting device is an electron beam emitting device, the at least two charged particle beam guns are at least two electron beam guns and the charged particle beams are electron beams.

11. The charged particle beam emitting device as claimed in claim 10, whereby the at least two electron beam guns are at least two cold field emitter electron beam guns.

12. The charged particle beam emitting device as claimed in claim 10, whereby each electron beam gun comprises a separate extractor electrode.

13. The charged particle beam emitting device as claimed in claim 1, whereby the charged particle beam emitting device is an ion beam emitting device, the at least two charged particle beam guns are at least two ion guns and the charged particle beams are ion beams.

14. The charged particle beam emitting device as claimed in claim 1, whereby the charged particle beam emitting device is adapted for attaching to a charged particle beam apparatus having a main optical axis such that the aperture opening of the aperture element is aligned with the main optical axis of the charged particle beam apparatus.

15. The charged particle beam emitting device as claimed in claim 1, whereby the emitting surfaces of the respective charged particle beam guns are accommodated in separate vacuum chambers.

16. A charged particle beam apparatus, comprising:
a charged particle beam emitting device as claimed in claim 1; and
an imaging element defining a main optical axis of the charged particle beam apparatus, the charged particle beam emitting device being arranged with respect to the imaging element such that the at least one aperture opening of the aperture element of the charged particle beam emitting device is aligned with respect to the main optical axis, the imaging element being adapted for focussing the respective charged particle beam of the first and second charged particle beam guns of the charged particle beam emitting device onto a specimen.

17. The charged particle beam apparatus as claimed in claim 16, whereby the charged particle beam apparatus comprises a control means for controlling the deflector unit and the imaging element, and a memory element for storing at least two sets of parameters, the memory element being connected with the control means, whereby each set of parameters is assigned to a respective one of the at least two charged particle beam guns and comprises parameter values for controlling the deflector unit and the imaging element.

18. The charged particle beam apparatus as claimed in claim 16, whereby the charged particle beam apparatus comprises a carrying element for movably carrying a specimen, a motion control unit for controlling the carrying element and a synchronising means adapted to synchronize the switching of the respective charged particle beams with a movement of the carrying element.

19. The charged particle beam apparatus as claimed in claim 18, whereby the carrying element is a stage for holding a specimen within the charged particle beam apparatus or a transfer unit for transferring a specimen into or out of the charged particle beam apparatus.

20. A method for operating a charged particle beam emitting device, the method comprising:
(a) generating at least a first charged particle beam by emitting charged particles from an emitting surface of a first charged particle emitter and generating at least a second charged particle beam by emitting charged particles from an emitting surface of a second charged particle emitter;
(b) directing the first charged particle beam on at least one aperture opening of an aperture element and deflecting the second charged particle beam from the at least one aperture opening;
(c) cleaning the emitting surfaces of the second charged particle emitter when its charged particle beam is deflected from the at least one aperture opening;
(d) subsequently to (c) directing the second charged particle beam on the at least one aperture opening of the aperture element and deflecting the first charged particle beam from the at least one aperture opening;
(e) cleaning the emitting surface of the first charged particle emitter when its charged particle beam is deflected from the at least one aperture opening; and
(f) repeating (b) to (e).

21. The method as claimed in claim 20, whereby the respective emitting surface is cleaned by applying at least one heating pulse to the emitting surface.

22. The method as claimed in claim 20, whereby the first and second charged particles beams are alternatively directed on the at least one aperture opening such as to form a substantially continuous particle beam passing through the at least one aperture opening.

23. The method as claimed in any of the claim 20, whereby the respective charged particle beam being deflected from the at least one aperture opening is directed on a blanking portion of the aperture element.

24. The method as claimed in claim 20, whereby a first control signal is applied for alternatively switching the first and second charged particles beam according to (b) and (d), and a second control signal is applied for alternatively cleaning the respective emitting surface of the first and second charged particle emitter according to (c) and (e), whereby the first control signal and the second control signal are applied such that the switching is performed with a time delay Δt with respect to the termination of the cleaning.

25. The method as claimed in claim 24, whereby Δt is between 0.5 sec and 120 sec.

26. The method as claimed in claim 20, whereby the method further comprises:
focussing the respective charged particle beam, which is directed on the at least one aperture opening, on at least one specimen; and
moving the specimen (72), whereby the movement of the specimen triggers at least one of (b) and (d).

27. The method as claimed in claim 26, whereby the movement of the specimen is a transfer of the specimen into or out of a vacuum chamber or a movement of the specimen within the vacuum chamber.

* * * * *

UNITED STATES PATENT AND TRADEMARK OFFICE
CERTIFICATE OF CORRECTION

PATENT NO. : 7,501,638 B1  Page 1 of 1
APPLICATION NO. : 11/553160
DATED : March 10, 2009
INVENTOR(S) : Fang Zhou It is certified that error appears in the above-identified patent and that said Letters Patent is hereby corrected as shown below:

On the Title Page Item (73)

Please delete "Halbeiterprüftechnik" and insert --Halbleiterprüftechnik-- therefor.

Signed and Sealed this

Twenty-third Day of June, 2009

JOHN DOLL
*Acting Director of the United States Patent and Trademark Office*